United States Patent [19]
Coverdill

[11] Patent Number: 5,848,365
[45] Date of Patent: Dec. 8, 1998

[54] DIAGNOSTIC METHOD AND SYSTEM FOR ELECTRICAL SYSTEM IN A TRUCK

[75] Inventor: Cary N. Coverdill, Boring, Oreg.

[73] Assignee: Freightliner Corporation, Portland, Oreg.

[21] Appl. No.: 652,797

[22] Filed: May 23, 1996

[51] Int. Cl.⁶ .......................... G06F 19/00; G01M 17/00
[52] U.S. Cl. ............................................. 701/35; 701/33
[58] Field of Search ................................ 701/29, 33, 34, 701/35, 50

[56] References Cited

U.S. PATENT DOCUMENTS

| | | | |
|---|---|---|---|
| 4,258,421 | 3/1981 | Juhasz et al. | 364/424 |
| 4,533,962 | 8/1985 | Decker et al. | 360/5 |
| 4,804,937 | 2/1989 | Barbiaux et al. | 340/52 F |
| 4,843,557 | 6/1989 | Ina et al. | 364/431.11 |
| 5,173,856 | 12/1992 | Purnell et al. | 364/424.04 |
| 5,250,761 | 10/1993 | Koyanagi | 177/141 |
| 5,276,619 | 1/1994 | Ohara et al. | 364/424.04 |
| 5,303,163 | 4/1994 | Ebaugh et al. | 364/550 |
| 5,327,347 | 7/1994 | Hagenbuch | 364/424.07 |
| 5,594,646 | 1/1997 | Itoh et al. | 364/424.04 |
| 5,638,273 | 6/1997 | Coiner et al. | 364/424.04 |

OTHER PUBLICATIONS

*Owner's Manual Caterpillar Driver Information Display*, Caterpillar, Feb., 1995.
*ProDriver™ User Manual*, Detroit Diesel Corporation, Mar., 1994.
*Celect RoadRelay™ User's Guide*, Cummins Cadec copyright 1993.

*Primary Examiner*—Michael Zanelli
*Attorney, Agent, or Firm*—Klarquist, Sparkman, Campbell, Leigh & Whinston, LLP

[57] ABSTRACT

A diagnostic method and system in a truck monitors voltages reported by electrical control units in a truck via a shared communication path called the data link. When a data logging unit on the data link detects an event, it persistently stores monitored data measured during a period that may span before and after the event occurred. The voltages measured and reported by electrical control units during this period are used to diagnose electrical wiring problems or other electrical problems in the electrical control units.

20 Claims, 6 Drawing Sheets

DIAGNOSTIC METHOD AND SYSTEM FOR ELECTRICAL SYSTEM IN A TRUCK

TECHNICAL FIELD

The invention relates to electrical systems in trucks and more specifically relates to a method and system for diagnosing electric wiring problems in a truck.

BACKGROUND

With the growing complexity of electronic systems within trucks, it has become increasingly difficult to diagnose electrical wiring problems. It is not uncommon for trucks to have several sophisticated electronic control units located throughout the vehicle. These electronic control units are typically connected to the battery and alternator in the truck via a network of wires. In this environment, unidentified electrical wiring problems are a major cause of concern.

As the number of sophisticated electronic devices on the trucks increases, the proper wiring and grounding of each of these devices becomes extremely important. The level of complexity of the electronic systems on trucks has made it very difficult for mechanics to diagnose electrical wiring problems. Unlike mechanical failures in truck parts, it is not possible for service technicians to observe wiring problems just by viewing the electrical systems or the wiring harnesses. As a result, special diagnostic tools are necessary to isolate problems and determine how to correct them.

Even with specific diagnostic tools, it is often difficult to diagnose electrical problems because they are often intermittent or transient. In many cases, a driver may observe electrical problems while operating the truck and bring it in for servicing. However, at the time of servicing, the service technicians are often unable to duplicate the problem.

There is a need, therefore, for improved methods and systems for diagnosing electrical problems in trucks.

SUMMARY OF THE INVENTION

The invention provides a method and system for diagnosing electrical problems in a vehicle. One embodiment of the invention is designed for use on a truck with an on-board communication link interconnecting electronic controls on the truck. However, the invention can be adapted for other diagnostic applications in vehicles as well.

In one embodiment, a communication link, which is separate from the vehicle wiring that brings power to the on-board electronics, is used to monitor and record voltage levels at a number of electronic devices on the vehicle. Specifically in one implementation, a data logging unit monitors and records voltage data transferred by other electronic control units over a shared data link. The electronic control units are programmed to transmit periodically, or transmit their voltage levels upon request. If an electrical fault occurs on a wiring harness or in a control unit, the voltage data recorded at the time the fault occurred can be used to diagnose the source of the fault.

The recorded voltage data can be retrieved from the data logging unit and displayed during servicing of the vehicle. In one implementation, the voltage data stored in an event file can be downloaded to an external computer and displayed using diagnostic software. With knowledge of the wiring of the vehicle and the voltages at the respective electronic control units, a service technician can more readily identify the source of the electrical problem. Both persistent and intermittent electrical problems, either in the wiring harness or in an electronic device, can be diagnosed more quickly and efficiently using this approach.

Further advantages and features of the invention will become apparent with reference to the following detailed description and accompanying drawings.

DETAILED DESCRIPTION

Figure 1:
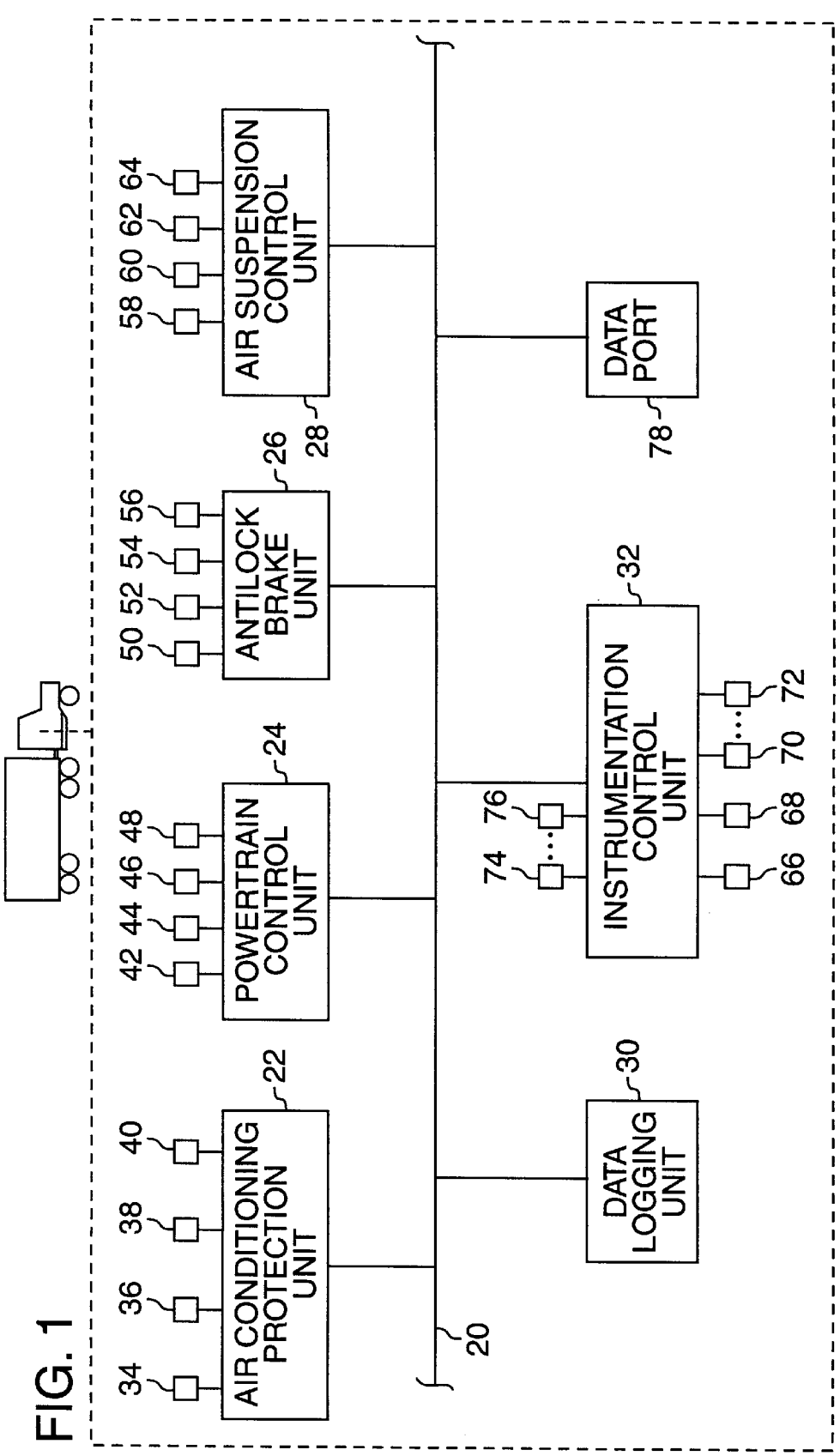
FIG. 1 is a block diagram illustrating the system architecture in an embodiment of the invention.

FIG. 1 is a block diagram illustrating the system architecture in an embodiment of the invention. The system architecture includes a number of electronic control units (ECUs) coupled together with a data link 20. In particular, the illustrated system includes an air conditioning protection unit 22, a powertrain control unit 24, an antilock brake unit 26, an air suspension control unit 28, a data logging unit 30, and an instrumentation control unit 32. The ECUs on the data link also typically have one or more sensors and actuators (34–76) used to monitor and control performance of the respective subsystems.

The system architecture in FIG. 1 also includes a data port 78 for coupling external devices to the on-board data link. This data port 78 enables an external computer to receive and transmit messages on the data link. It also enables an external computer establish a connection with an ECU (24–32) on the network to either download data or retrieve data from memory of an ECU on the data link.

The data link 20, in this implementation, is a serial communication path connecting the ECUs together. This particular data link is designed according to SAE J1708, a standard for serial data communication between microcomputer systems in heavy duty vehicle applications. While this specific embodiment is based on the J1708 standard, it is not critical that the invention be implemented in this specific manner. One alternative example is to use a data link constructed according to SAE J1939.

In one specific embodiment, the data link 20 is comprised of a twisted pair cable operating at 9600 baud. Designed according to the SAE J1708 standard, the data link forms a communication channel among electronic control units coupled to it. Electronic control units generate a digital signal on the data link by applying a voltage differential between the two wires in the cable. A voltage differential above a specified threshold represents a logic high value, while a voltage threshold below a specified threshold represents a logic low value. This type of data link is particularly advantageous for hostile environments because the signal is more robust and impervious to signal degradation. However, other alternative communication media could be used in place of the J1708 cable.

The ECUs connected on the network communicate with each other according to protocols such as defined in SAE J1708 and SAE J1587. The SAE J1587 standard is entitled "Joint SAE/TMC Electronic Data Interchange Between Microcomputer Systems and Heavy Duty Vehicle Applications." This standard defines the format of data and messages communicated among microprocessors connected to a shared data link, and is specifically adapted for use with SAE J1708.

According to SAE J1708/J1587, the ECUs 22–32 on the data link 20 communicate by passing messages to each other. The ECUs can be either receivers, or receivers and transmitters. In this particular implementation, the instrumentation control unit 32 is a transmitter and a receiver. It acts as a transmitter when requesting data from or resetting the ECUs on the data link 20, and acts as a receiver when listening for data issued from the ECUs.

A message in this format includes the following: 1) a message ID (MID), 2) one or more parameters, and 3) a checksum. The number of parameters in a message is limited by the total message length defined in the SAE J1708 standard. The message identification numbers are assigned to transmitter categories as identified in SAE J1587. The MID portion of a message specifies the origin or transmitter of the message. In the majority of cases, messages are broadcast on the data link without specifying a receiver. However, the message format can be extended to include the MID of a receiver after the MID of the transmitter.

The messages passed among the ECUs convey information by one or more parameters contained within them. According to the SAE J1587 standard, the first character of every parameter is a parameter identification character (PID). The parameter data identified by the PID directly follows the PID. The SAE J1587 supports different data formats including a single character, a double data character or more than two data characters representing the parameter data. Several parameters can be packed into a message, limited by the maximum message size as referred to above.

In this implementation, the ECUs 22–32 communicate with each other over the data link 20 according to the SAE standard J1708. The standard describes methods for accessing the data link and constructing messages for transfer over it. It also defines a method for resource contention among the ECUs on the data link.

An ECU wishing to transmit data on the data link first waits for a lull in transmission of data on the data link. In this particular implementation, the length of the lull is 200 milliseconds. After detecting this lull, the ECU attempts to transmit its message. The transmitter broadcasts its message onto the data link. Each of the ECUs that operate as receivers on the data link will receive the message. However, receivers only act on a message if programmed to do so.

In some cases two or more transmitters may attempt to broadcast a message at one time, giving rise to a collision. To resolve a conflict among transmitters, messages have a priority according to their message identifiers. The MIDs of higher priority transmitters have a greater number of bits set at a logic level one. When more than one message is broadcast at a time, the more dominant message takes priority over lesser dominant messages. Since a lower priority message is blocked by a higher priority message, the transmitter of the lower priority message must wait and retransmit the message after another lull. An ECU on the data link will continue to attempt to send a message until it is successfully broadcast to the data link.

Figure 2:
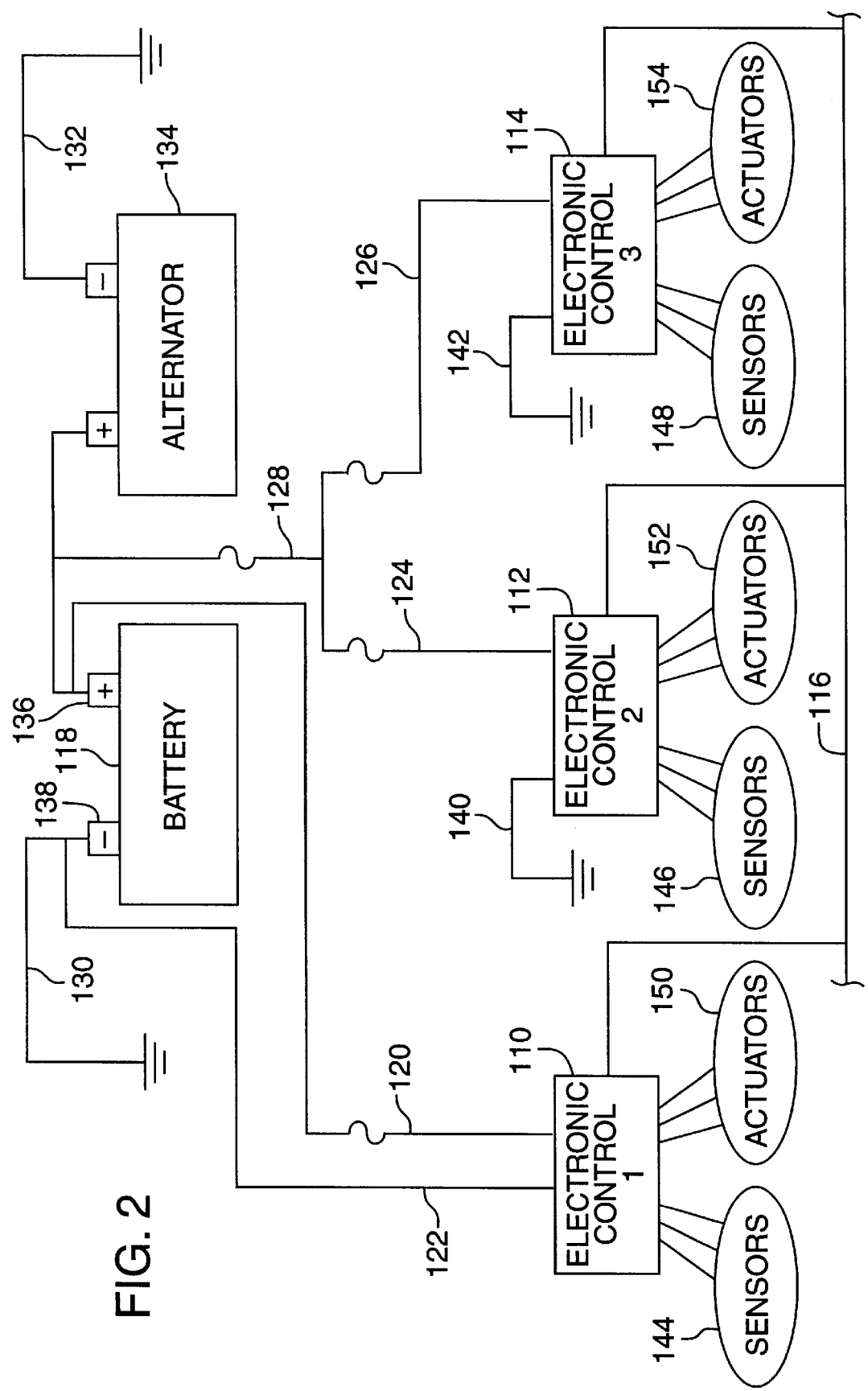
FIG. 2 is a block diagram of an example of electrical wiring in a truck.

FIG. 2 is a block diagram of a simplified example of electrical wiring in a truck. This diagram illustrates how the ECUs 110, 112, 114 on a data link 116 can be coupled to a power supply 118 in the vehicle via electrical wiring 120–132. The electrical wiring is typically connected throughout the vehicle using a wiring harness or harnesses.

As shown, the ECUs 110–114 are each powered by the battery 118, and the battery is charged by the alternator 134. Some of the ECUs (110 for example) are connected to the power and ground terminals 136, 138 of the battery 118, while others have chassis grounds 140, 142 (see 112 and 114 for example). The ECUs may include a number of sensors 144–148 and/or actuators 150–154 to measure or control performance of their respective subsystems in the truck.

Figure 4:
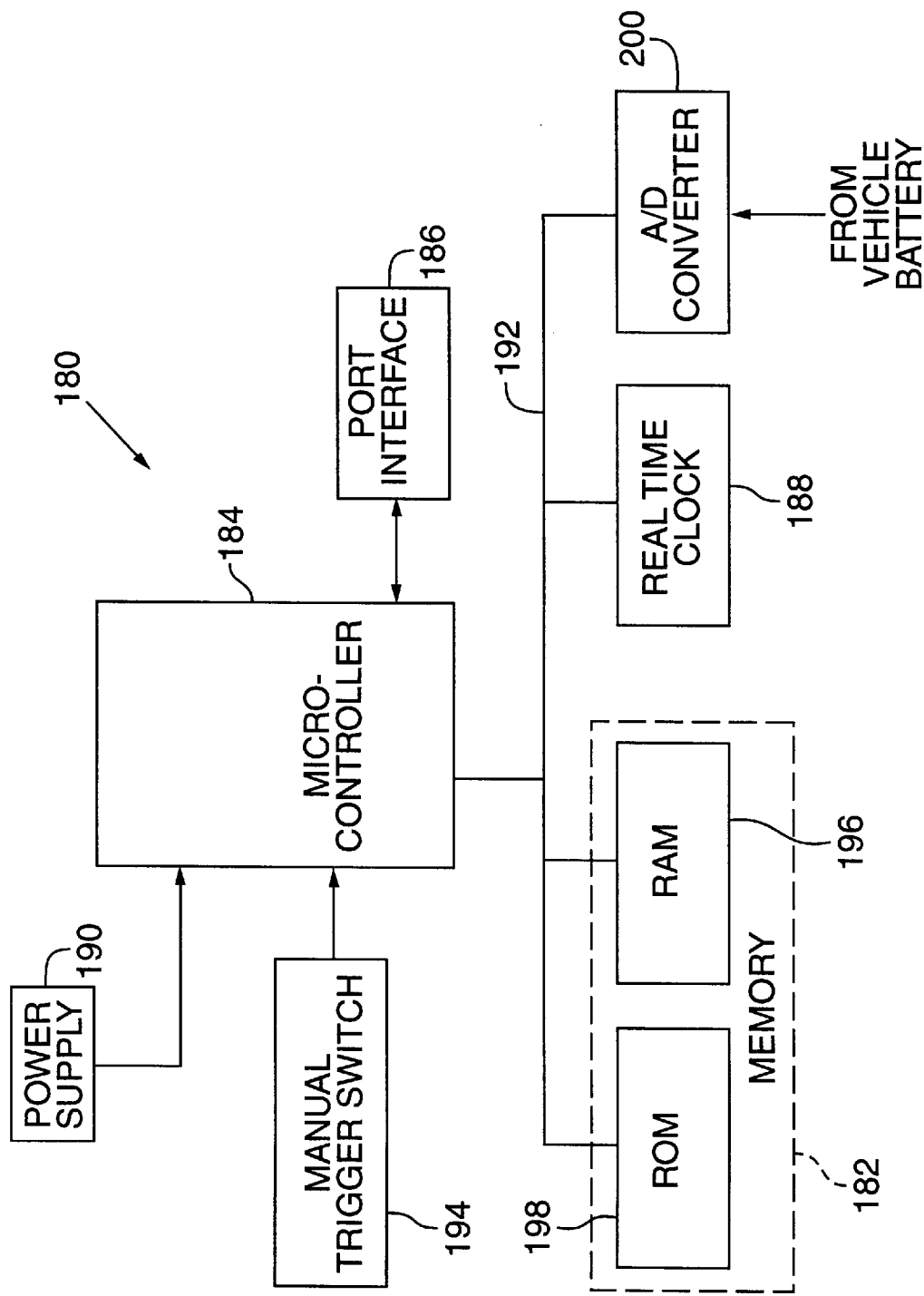
FIG. 4 is block diagram illustrating the data logging unit in one embodiment of the invention.

Even in the simple example shown in FIG. 4, one can readily see that there are a variety of locations where an electrical problem can occur. A short or open circuit can occur anywhere in the wiring of the vehicle. This type of failure can impact a single ECU or several ECUs depending on its location in the network of wiring. In addition, ECUs can experience electrical problems internally.

To assist in isolating these electrical problems, the ECUs can be programmed to measure their voltage and report it on the data link. The data link provides a path, independent from the wiring network, that can be used to convey voltage data when electrical problems occur. This voltage data is extremely valuable in diagnosing electrical problems because it provides a system wide view of voltages at the critical moments when an electrical problem has occurred.

To use this voltage data for diagnostic purposes, it is first recorded using a data logging unit on the data link. The voltage data captured by the data logging unit can be downloaded to an external computer for use in diagnosing an electrical problem.

Figure 3:
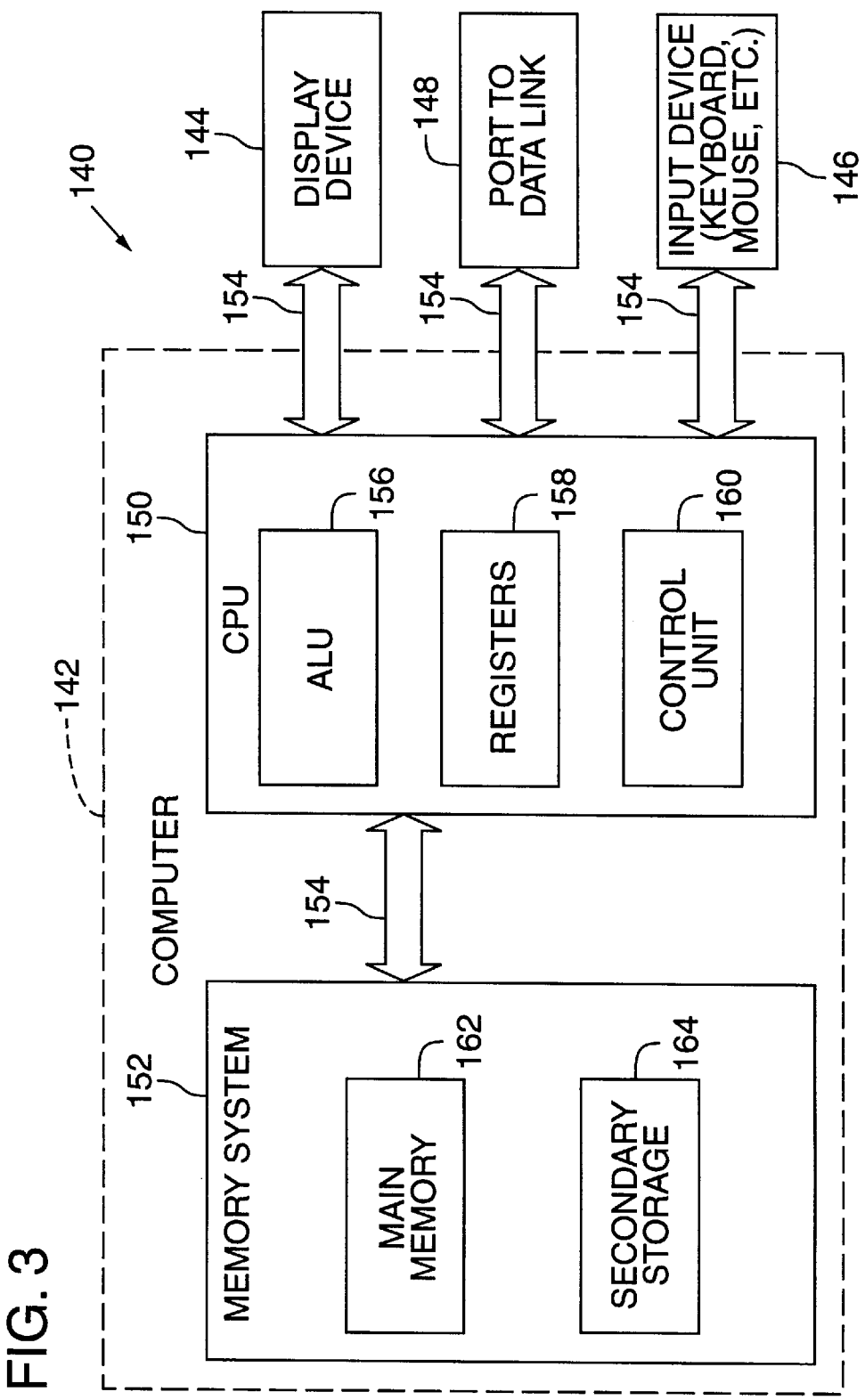
FIG. 3 is a block diagram illustrating an external computer coupled to the on-board data processing system.

FIG. 3 is a block diagram illustrating an external computer system coupled to the on-board data processing system. Service technicians or other users can use an external computer coupled to the data link to download diagnostic data from the on-board electronics. In one implementation, the external computer is an IBM-compatible PC, equipped with the Windows Operating System from Microsoft Corporation and ServiceLink from Freightliner Corporation, an application program used to communicate with an ECU on the data link. A variety of alternative computers and computer architectures are also possible as evidenced by the general nature of the computer architecture shown in FIG. 4.

The computer system 140 includes as its basic elements a computer 142, a display device 144, an input device 146, and serial communication link 148 to the data port 74 on the data link 20.

The external computer 142 generally includes at least one high speed processing unit (CPU) 150 and a memory system 152 that communicate through a bus structure 154. CPU 150 includes an arithmetic logic unit (ALU) 156 for performing computations, registers 158 for temporary storage of data and instructions and a control unit 160 for controlling the operation of computer system 140 in response to instructions from a computer program such as an application or an operating system. Any of a variety of processors, including those from Digital Equipment, Sun, IBM, Motorola, NEC, Intel, Cyrix, AMD, and Nexgen can be used as the CPU 150. Although shown with one CPU 150, computer system 140 may alternatively include multiple processing units.

Memory system 152 generally includes high-speed main memory 162 in the form of a medium such as random access memory (RAM) and read only memory (ROM) semiconductor devices and secondary storage 164 in the form of a medium such as floppy disks, hard disks, tape, CD-ROM, etc. and other devices that use electrical, magnetic, optical or other recording material. Main memory 162 stores programs such as a computer's operating system and currently running application programs. Main memory 162 also includes video display memory for displaying images through a display device.

Input device 146 and the port 148 to the data link 20 are peripheral devices connected by bus structure 154 to computer 142. Input device 146 may be a keyboard, a pointing device such as a mouse, a pen, or other device for providing input data to the computer.

It should be understood that FIG. 3 is a block diagram illustrating the basic elements of a computer system; the figure is not intended to illustrate a specific architecture for a computer system 140. For example, no particular bus structure is shown because various bus structures known in the field of computer design may be used to interconnect the elements of the computer system in a number of ways, as desired. CPU 150 may be comprised of a discrete ALU 156, registers 158 and control unit 160 or may be a single device in which one or more of these parts of the CPU are integrated together, such as in a microprocessor. Moreover, the number and arrangement of the elements of the computer system may be varied from what is shown and described in ways known in the art.

An external computer 140, such as a PC, communicates with the data link 20 on board the truck through the data port 78 (FIG. 1). As noted above, the data link 20 can be implemented according to the SAE standards J1708/J1587. In this case, the external computer communicates with the ECUs on the data link according to the J1587 and J1708 protocols.

FIG. 4 is block diagram illustrating the data logging unit in one embodiment of the invention. The data logging unit monitors and records faults and events. In particular the data logging unit can monitor voltages measured at the ECUs on the data link as explained in more detail below, the capability to monitor and record voltages and other parameters over the data link is useful in diagnosing electrical problems.

The data logging unit 180 generally includes memory 182, a microcontroller 184, an interface 186 to the data link, a real time clock 188, and a power supply 190. The memory 182 and the real time clock are coupled to the microcontroller 184 via a bus 192.

In this implementation, the power supply includes a control chip that supplies power to the microcontroller from either the vehicle battery or a secondary power source such as a lithium battery. The lithium battery serves as a back-up in the event that the voltage supplied from the battery is insufficient or unavailable.

The data logging unit is coupled to a keypad of the ICU (FIG. 1) to receive an interrupt when a user actuates an event key on the keypad. The event key enables a driver or passenger of the vehicle to record an event, which causes the data logging unit to record a predefined list of vehicle performance and diagnostic parameters. The connection between the keypad and the data logging unit is represented by the manual trigger switch 194 shown in FIG. 4. The data logging unit can also receive interrupts from other devices as well.

The memory 182 of the data includes both RAM 196 and ROM 198. This implementation includes 128 KB of ROM, which stores the application code executed by the microcontroller. This executable code includes the set-up routines used to boot the data logging unit and the data logging routines used to monitor predefined events. This implementation also includes 256 KB of battery-backed RAM, which is used to implement one form of a temporary storage device such as a FIFO buffer for capturing data from the data link and to store event files.

In this implementation, the data logging unit monitors voltage supplied by the vehicle battery through an analog to digital converter 200, which converts the 12 volt signal from the battery to a digital signal compatible with the microcontroller 184.

The real time clock 188 is used to track time in the truck. While recording event data, the data logging unit preferably time stamps data with the time kept by the real time clock. In this implementation, the data logging unit is the centralized time keeper for the ECUs on the data link. Thus, it serves as a common time reference for faults and events that occur in the system.

The data logging unit performs a data monitoring function. Coupled to the data link, the data logging unit listens for periodic data messages broadcast over the data link. The data link continuously records a snapshot of data from the data link into the FIFO buffer. In this implementation, the data logging unit is programmed to continuously store the most recent 60 seconds of data from the data link. The number of intervals, the length of time of the interval or intervals, and the types of parameters that are temporarily stored in the data logging unit can vary. By storing data temporarily, the data logging unit is capable of capturing historical data before an event or fault occurs. Some examples of the data monitored by the data logging unit are set forth below. The name of the parameter is followed by the parameter identification number (PID) as set forth in the SAE J1587 standard.

Vehicle Road Speed; PID 84
Percent Throttle; PID 91
Percent Engine Load; PID 92
Output Torque; PID 93
Engine Oil Pressure; PID 100
Turbo Boost Pressure; PID 102
Coolant Temperature; PID 110
Engine Speed (RPM); PID 190

For some types of data, the data logging unit captures a new instance or slice of data once every second and stores it in the buffer. When the buffer is full, the most recent second of data overwrites the oldest snapshot of data.

In addition to continuously storing the data listed above, the data logging unit also monitors predefined events. These events can be defined by a PID broadcast on the data link, or by a discrete signal (such as an interrupt) received at the data logging unit. When one of the predefined events occurs, the data logging unit can store vehicle performance data before, during or after an event. The data logging unit can be programmed to control the types of parameters stored in response to a particular event, and to specify whether these parameters are stored before, during and after the event.

In one specific implementation, the data logging unit stores the last 60 seconds worth of data to memory and begins storing the next 60 seconds worth of data for certain parameters. In total, the amount of data stored for an event includes two minutes and one second worth of data. This data is recorded in an event file in memory. An external computer can be coupled to the data link to extract one or more event files from the data logging unit.

Examples of events particularly relating to electrical problems include: ECU battery voltage low, ECU battery voltage high, low or intermittent battery power to ECU, voltage out of range. These events are typically reported as faults to the data logging unit via the data link. However, it is also possible for the data logging unit to detect an event representing voltage problem via a discrete sensor coupled to it. For instance, the data logging unit may sense that the voltage supplied to it by the battery is too low or too high and trigger an event.

In response to these events relating to possible electrical problems, the data logging unit can then record voltage and other parameters and store them in an event file for future use in servicing the vehicle. For instance if data logging unit detects one of the above listed events, it proceeds to record predefined voltage parameters. The data logging unit may also store other parameters such as road speed, odometer reading, etc. In one specific embodiment, the battery voltages measured at the ECUs on the data link are recorded along with additional parameters such as the odometer reading. As explained further below, the data logging unit can record parameters from before the event occurred, at the time the event occurred, and after the event occurred. In general, the data logging unit records these parameters at about the time the event occurred. In this context, the phrase "at about the time" means within one minute before or after the event occurred.

Figure 5:
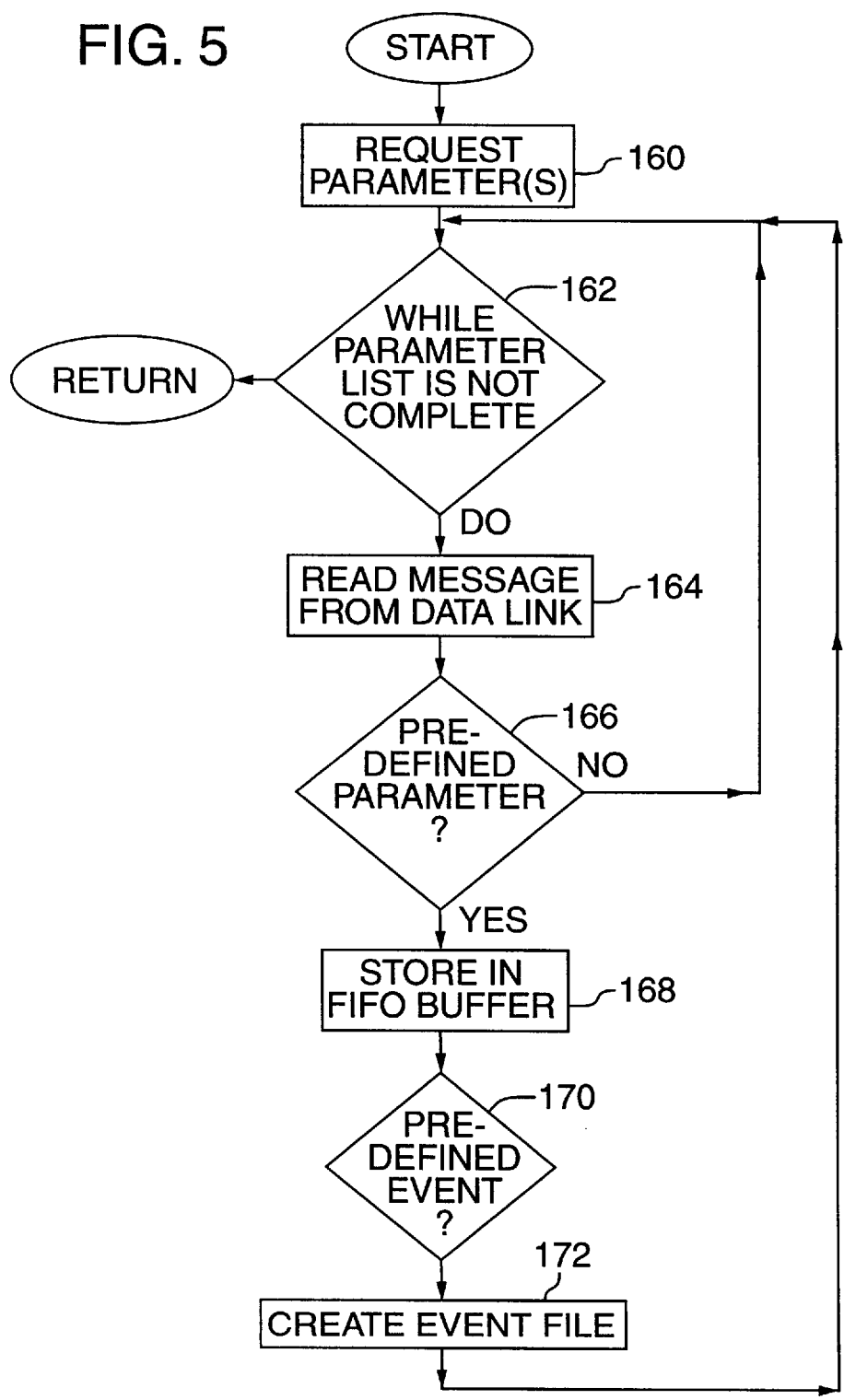
FIG. 5 is a flow diagram illustrating one method for recording events from the data link in an embodiment of the invention.

FIG. 5 is a flow diagram illustrating a process for monitoring and recording voltage parameters in an embodiment. In this particular embodiment, the data logging unit continuously monitors voltage parameters as well as additional parameters that the other ECUs report on the data link. In response to certain types of events such as a type of fault or an event entered by the driver, the data logging unit records the voltage parameters and other predefined parameters for later use in diagnosing electrical problems in the vehicle.

FIG. 5 specifically illustrates how the data logging unit monitors for events while temporarily storing predefined parameters in a buffer. In this particular implementation, the data logging unit is programmed to temporarily maintain a specific list of parameters at regular intervals. The intervals in this case are spaced one second apart. However, this interval is only a detail of this particular design and can vary.

While maintaining this list of parameters, the data logging unit also monitors for events. If the data logging unit detects an event while monitoring and temporarily storing parameters, it creates an event file to persistently store the predefined parameters. The flow diagram shows how the data logging unit proceeds at each interval.

The data logging unit begins by obtaining a message from the data link. One way to obtain a message from the data link is to program the data logging unit to request a parameter or parameters from the data link (160). In this case, the data logging unit first broadcasts a request for specified parameters on the data link. In response, the ECUs construct a message or messages, each including one or more parameters, and broadcast the resulting data on the data link. The data logging unit then stores the requested parameters.

As an alternative to, or in addition to issuing specific requests for parameters, the data logging unit can be programmed to store parameters that are automatically generated by the ECUs on the data link. An ECU on the data link can be programmed to broadcast parameters periodically. For example, the ECUs on the data link can be programmed to broadcast a voltage parameter specifying the level of the voltage supplied to the ECU. When the ECUs automatically generate parameters in this manner, the data logging unit does not have to specifically request parameters. Instead, it can be programmed to monitor and store predefined parameters broadcast on the data link.

In one embodiment implemented on the J1708 data link, the voltage parameters transmitted by the ECUs conform to the J1587 standard. In this standard, the specification for the voltage parameter representing battery voltage measured at the ECU is as follows:

| PID 168 - Battery Potential (Voltage) - Measured electrical potential of the battery. | |
|---|---|
| Parameter Data Length: | 2 Characters |
| Data Type: | Unsigned Integer |
| Bit Resolution: | 0.05 V |
| Maximum Range: | 0.0 to 3276.75 V |
| Transmission Update Period: | 1.0 s |
| Message Priority: | 5 |

| Format: | PID | Data |
|---|---|---|
| | 168 | a a |
| | a a | battery potential (voltage) |

This is only one possible example of the type of data and the format of the data for a voltage parameters monitored and recorded by the data logging unit.

In the implementation illustrated in FIG. 5, the data logging unit specifically requests some parameters and monitors others that are automatically broadcast by other ECUs. After issuing a request for one or more parameters, the data logging unit proceeds to retrieve the predefined parameters for the interval. This particular diagram illustrates that the data logging unit enters a loop in the process of retrieving the parameters (162). This loop simply reflects that the data logging unit performs an iterative process in gathering the predefined parameters for an interval. The manner in which this data gathering loop is implemented may vary.

To gather the parameters for an interval, the data logging unit proceeds to read messages from the data link. As the data logging unit reads parameters from the data link, it decides whether to store or disregard them (164). The data logging unit is programmed to store a specific set of predefined parameters, and simply ignores messages that do not include the predefined parameters (166).

If the data logging unit identifies a predefined parameter, it stores the parameter in temporary storage (168). In the illustrated method, the temporary storage refers to a first in, first out buffer implemented in the memory of the data logging unit. This buffer stores the list of parameters captured at each interval for a predetermined amount of intervals. In addition to the data monitored from the data link, it also stores data that it generates such as its own voltage level and a time stamp from the real time clock.

In this implementation, the buffer is designed to store the predefined parameters reported on the data link and generated internally for 60 intervals. Once the buffer is filled with this amount of data, it then rewrites the oldest second worth of data with the incoming second worth of data. The buffer, therefore, acts as a first in, first out memory.

The operation of the FIFO buffer enables the data logging unit to maintain a predetermined amount of the most recent data retrieved from the data link. In this case, the data logging unit is able to maintain 60 intervals worth of parameters before any event occurs.

The data logging unit is programmed to monitor for a specific set of events. In this embodiment, events can be generated in a number of alternative ways. An event can be a parameter or fault broadcast on the data link, or can be an electrical signal applied to a sensor of the data logging unit. For example, one type of an event is a driver event entered by the driver via the keypad of the ICU. This event can be communicated to the data logging unit via a discrete wiring path between the ICU and the data logging unit. Alternatively, the event can be passed to the data logging unit over the data link.

As noted above, specific events relating to electrical problems include: ECU battery voltage low, ECU battery voltage high, low or intermittent battery power to ECU, voltage out of range. The data logging unit detects these events on the data link when the originating device broadcasts a diagnostic message. In the J1587 standard, this diagnostic message is identified by PID 194, which includes the message ID, the parameter ID, diagnostic codes, and an occurrence count. A complete specification of PID 194 is set forth below.

| PID 194 - Transmitter System Diagnostic Code and Occurrence Count Table | |
|---|---|
| Parameter Data Length: | Variable |
| Data Type: | Binary Bit-Mapped |
| Resolution: | Binary |
| Maximum Range: | 0 to 255 |
| Transmission Update Period: | The diagnostic code is transmitted once whenever the fault becomes active and once whenever the fault becomes inactive but never more than once per second. All diagnostic codes are also available on request. All active diagnostic codes are retransmitted at a rate greater than or equal to the refresh rate of the associated PID but not greater than once per second. Active diagnostic codes for on-request PIDs and SIDs are transmitted at a rate of once every 15 seconds. |
| Message Priority: | 8 |

| Format: | PID | Data |
|---|---|---|
| | 194 | n a b c a b c a b c a b c a b c . . . |
| | n | Byte count of data that follows this character. This excludes characters MID, PID 194, and n but includes a, b and c type characters. |
| | a | SID or PID of a standard diagnostic code. |
| | b | Diagnostic code character.<br>Bit 8: Occurrence Count included<br>    1 = count is included<br>    0 = count not included<br>Bit 7: Current Status of fault<br>    1 = fault is inactive<br>    0 = fault is active<br>Bit 6: Type of diagnostic code<br>    1 = standard diagnostic code<br>    0 = expansion diagnostic code PID (PID from page 2)<br>Bit 5: Low character identifier for a standard diagnostic code<br>    1 = low character is subsystem identifier (SID)<br>    0 = low character is parameter identifier (PID)<br>Bits 4–1: Failure mode identifier (FMI) of a standard diagnostic code |
| | c | Occurrence count for the diagnostic code defined by the preceding 2 characters. The count is optional and bit 8 of the first character of the diagnostic code is used to determine if it is included. |

When the data logging unit detects an event, it invokes a routine to create an event file (172). In one specific implementation, the data logging unit has a multi-tasking operating system which enables a number of processes to operate substantially concurrently. When one of the predefined events is detected, the data logging unit invokes a process to create an event file.

If the data logging unit detects an event, then it can store a number of predefined parameters before, at, or after the event in persistent storage. To persistently store the predefined parameters before the event occurred, the data logging unit makes a copy of the contents of the FIFO buffer (or other temporary storage used to hold the parameters) and places this copy in the event file. The data logging unit then persistently stores the predefined parameters at the time of the event and for a number of intervals after the event.

Figure 6:
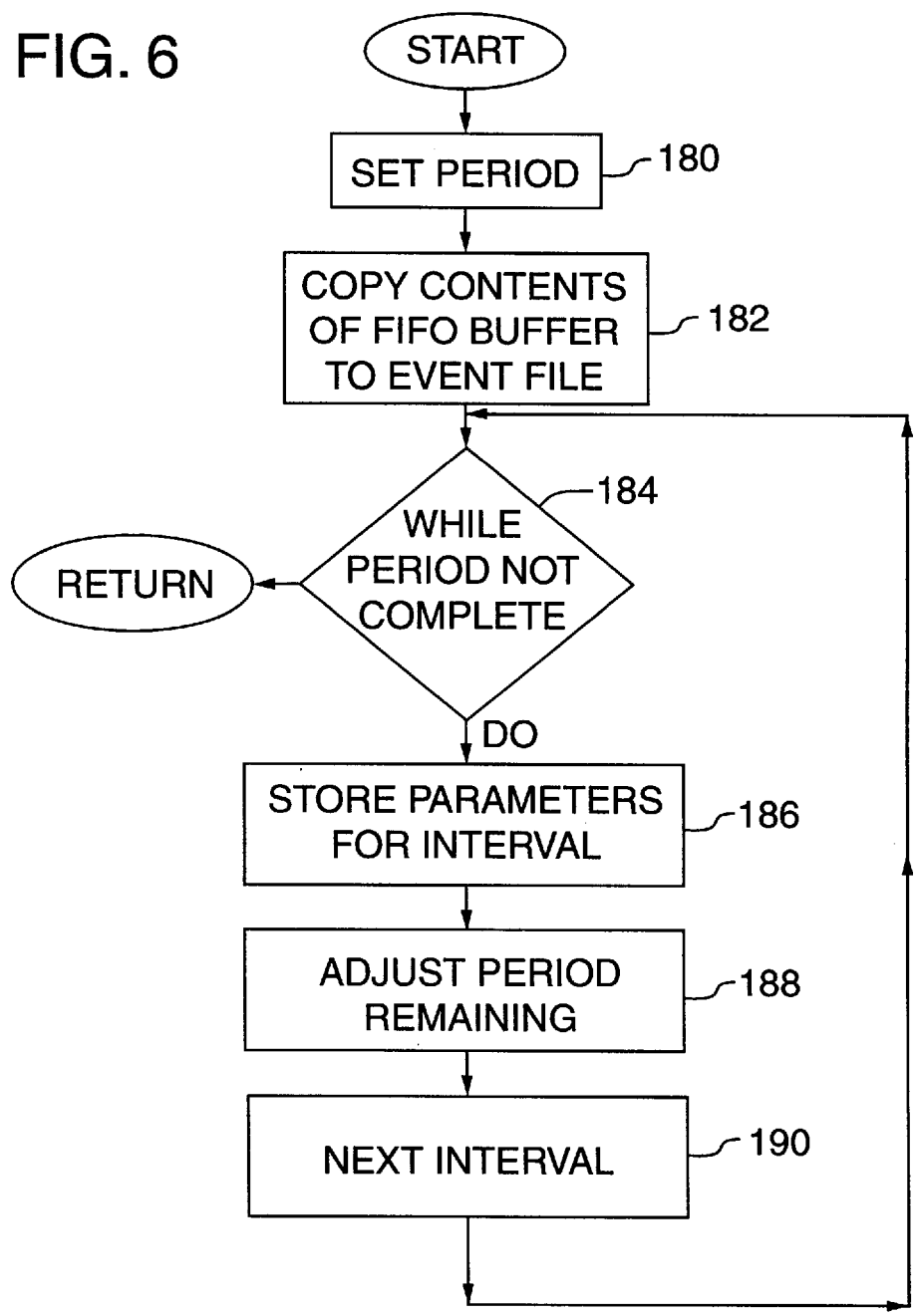
FIG. 6 is a flow diagram illustrating one process for creating an event file in an embodiment of the invention.

FIG. 6 is a flow diagram illustrating the process for creating an event file. When it detects a new event, the data logging unit sets a period for storing predefined events occurring after the new event (180). This period is 60 intervals long in this implementation. Since each interval is one second long, the data logging unit persistently stores the predefined parameters for a period spanning one minute after the event occurred, with updates occurring every second.

To capture the predefined parameters that occurred before the event, the data logging unit copies the contents of the FIFO buffer as of the time of the event to the event file (182). It then proceeds to capture the predefined parameters after the event occurred.

As long as 60 intervals (or some other time period) have not elapsed (184), the data logging unit continues to store the predefined parameters for each interval (186). The process of retrieving the predefined parameters proceeds as described above in connection with FIG. 5. However, in addition to storing the parameters in the FIFO buffer, the parameters are also stored in the event file. When the data logging unit identifies a predefined parameter, it proceeds to store the parameter in the event file. It repeats this process in the interval until the predefined parameters are stored in the event file.

At each interval, the data logging unit adjusts the period remaining to complete the creation of the event file (188). This step can be implemented in a variety of ways. For example, a counter can be used to count from 1 to 60 intervals, or from 60 down to 0 intervals. In either case, the data logging unit is programmed to keep track of the number of intervals remaining to create the event file. The next step 190 and the return path to step 184 represents the iterative process of collecting the predefined parameters at each interval. As shown, the process of copying the predefined parameters to the event file repeats until the predetermined period, in this case 60 intervals, has elapsed.

The data logging unit, in this implementation, creates an event file for each event that it is programmed to detect. If it happens to detect an event while creating another event file, it will launch a separate process to construct another event file. Each process for creating an event file has access to the FIFO buffer for tracking the predefined parameters that were recorded before the event occurred. Each process also has access to the predefined parameters as the data logger receives them. The data logging unit, therefore, is capable of creating several event files concurrently.

In some cases it is useful to avoid initiating the process of creating an event file. This is particularly true when the same event is repeated in a very short time span. Consider for example, an event triggered by the driver at the keypad of the ICU. When the driver triggers this event, the data logging unit creates an event file, tracking predefined parameters for intervals spanning one minute before and after the event. If the driver triggers another event during the time when the data logging unit is creating an event file for the previous event, then the resulting event file would include overlapping data. To avoid this, the driver is prevented from triggering another event for a predetermined time so that the data logging unit does not generate an event file with duplicative data.

The event file or files stored in the data logging unit can be used to diagnose electrical wiring problems in the truck. In one implementation, an event file can be downloaded to an external computer, such as a PC, via the data port on the data link. The PC then displays the event file in a format that describes the originating ECUs and the associated voltages over a two minute time span surrounding the occurrence of the event (i.e. one minute before, and one minute after). When combined with a specification of the wiring system in the vehicle, the voltage data from the event file can be used to isolate where an electrical problem occurred and to determine the cause of the problem.

An example of software for communicating with the data logging unit and displaying event file data on a PC is ServiceLink diagnostic software from Freightliner Corporation. ServiceLink diagnostic software is only one example. Other software may be used for downloading an event file from the data logging unit according to the J1708/J1587 standards. Other software may be used for displaying the contents of the event file.

In addition to displaying the data in an event file, an external computer system can be programmed to assist a service technician in isolating electrical problems. As shown in FIG. 4, the structure of the wiring from the ECUs is similar to a tree structure. When an electrical problem is observed in one of the ECUs and not others, for example, the source of the fault can be isolated to the portion of the tree that is unique to the ECU. Similarly, if an electrical problem is observed for a number of ECUs, the source of the fault can be isolated to a portion of the tree that is common to each of the ECUs. With knowledge of this tree structure and the history of voltages measured at the ECUs over a period of time surrounding an event, a computer can be used to identify possible sources of the problem.

While we have described our invention with reference to specific embodiments, we do not intend to limit our invention to these embodiments. The invention can be implemented in a variety of ways. For example, the communication medium between the data logging unit and the ECUs can be implemented in a variety of ways. As explained above, in some cases events can be communicated to the data logging unit via a dedicated electrical connection, via a message over the shared communication link, or both ways. The data link in the embodiment above is implemented according to SAE J1708, but it can implemented in other ways. For instance, the data link may be implemented according to SAE J1939, or other communication protocol for communication among microprocessor devices.

The data logging unit can also be implemented in a variety of alternative ways. The manner in which it monitors and records data from the data link can vary. In the embodiments described above, the data logging unit performs monitoring functions by listening for messages formatted according to SAE 1587. However, the method for monitoring parameters and faults can vary depending on the media. The manner in which the data logging unit temporarily and persistently stores data can also vary. The flow diagrams illustrate specific schemes for achieving this functionality, but a number of alternatives are possible as well.

Having described and illustrated the principles of our invention with reference to a preferred embodiment and several alternative embodiments, it should be apparent that the invention can be modified in arrangement and detail without departing from its principles. Accordingly, we claim all modifications as may come within the scope and spirit of the following claims.

I claim:

1. In an electronic control system for a truck comprising a plurality of electronic control units connected to an electrical wiring system and coupled together via a data link, a method for diagnosing electrical problems comprising:

receiving voltage parameters reported by the electrical control units via the data link at a plurality of times, where the voltage parameters represent a measured electrical potential at a predetermined location in the electrical wiring of the truck;

storing the voltage parameters;

monitoring for events reported by one or more of the electronic control units on the data link; and in response to a reported event, recording voltage parameters reported by the electrical control units at about the time the event occurred such that voltages applied to the electronic control units at about the time the event occurred can be reviewed.

2. The method of claim 1 in which the recording step includes recording reported voltage parameters for a time period covering time before and after the time of the event.

3. The method of claim 1 further including the steps of:

receiving predefined parameters representing any one of truck performance and diagnostic data measured by the electronic control units on the data link, wherein the predefined parameters are repetitively updated by the electronic control units; and wherein the storing step includes storing the predefined parameters.

4. The method of claim 3 wherein the predefined parameters include mileage and road speed of the truck.

5. The method of claim 1 further including the step of:

storing a time stamp along with the voltage parameters.

6. The method of claim 1 wherein the storing step comprises the step of temporarily storing voltage parameters in a first storage device, and wherein the step of recording the voltage parameters includes transferring the voltage parameters temporarily stored in the first storage device to a persistent storage device, the temporarily stored voltage parameters that are transferred to the persistent storage device covering a time period from before the time the event occurred.

7. The method of claim 1 wherein the step of receiving voltage parameters comprises receiving the voltage parameters via a shared serial communication link.

8. The method of claim 1 wherein the storing step comprises the step of storing a predefined number of the most recent voltage parameters reported by the electronic control units in a first in first out buffer.

9. The method of claim 8 wherein the recording step comprises the step of transferring a number of voltage parameters for times before the occurrence of the event to a persistent storage.

10. The method of claim 9 wherein the step of recording the voltage parameters comprises storing the voltage parameters in an event file in persistent storage; and further including:

downloading the event file to memory of an external computer via a data port on the data link.

11. The method of claim 10 further including:

displaying voltage parameters along with data identifying associated electronic control units on a display device of the external computer.

12. The method of claim 1 wherein the step of recording the voltage parameters comprises storing the voltage parameters in an event file in a persistent storage; and further including:

downloading the event file to memory of an external computer via a data port on the data link.

13. The method of claim 12 further including:
displaying voltage parameters along with data identifying associated electronic control units on a display device of the external computer.

14. The method of claim 1 where the events include a detection of one or more of the following events: electronic control unit battery low, electronic control unit battery high, low or intermittent vehicle battery power to electronic control unit, voltage at electronic control unit out of range.

15. A diagnostic system on a vehicle for monitoring and diagnosing electrical problems in an electrical wiring harness on the vehicle, the system comprising:

a data link;

a plurality of electronic control units interconnected through the data link, the electronic control units programmed to report voltage parameters to the data link at predefined intervals, wherein the voltage parameters represent a measured electrical potential at a predetermined location in the electrical wiring harness of the vehicle and the electrical wiring harness couples the plurality of electronic control units to a vehicle battery; and a data logging unit in communication with the data link, the data logging unit being operable to read the voltage parameters from the data link and operable to record the voltage parameters in response to the occurrence of an event such that the voltage parameters reported by the electronic control units at about the time the predefined event occurred can be used in diagnosing an electrical problem.

16. The diagnostic system of claim 15 wherein the data logging unit includes a buffer, and wherein the data logging unit is operable to temporarily store a predefined number of the most recent voltage parameters in the buffer relative to the time of the occurrence of the event.

17. The diagnostic system of claim 15 wherein the data logging unit is operable to monitor for predefined events by reading parameters reported by the electronic control units on the data link.

18. The diagnostic system of claim 15 wherein the data logging unit is operable to monitor for user defined events entered by the user on the data link.

19. A diagnostic system on a truck for monitoring and diagnosing electrical problems in a wiring harness on the truck, the system comprising:

a serial communication data link;

a plurality of electronic control units interconnected through the serial communication data link, the electronic control units programmed to broadcast one or more predefined parameters including a voltage parameter on the serial communication data link at predefined intervals, wherein the voltage parameters represent a measured electrical potential at a predetermined location in the wiring harness of the truck, and wherein the electrical wiring harness couples the plurality of electronic control units to a vehicle battery; and a data logging unit in communication with the data link, the data logging unit being operable to read the voltage parameters from the data link and operable to record the voltage parameters in response to any one of a predefined and user defined event so that the voltage parameters reported by the electronic control units at about the time the predefined event occurred can be used in diagnosing an electrical problem.

20. A system according to claim 19 wherein the data logging unit includes temporary and persistent storage, the data logging unit being operable to temporarily store voltage parameters in the temporary storage and to transfer the temporarily stored voltage parameters to the persistent storage to record the transferred voltage parameters upon the occurrence of an event, and the data logging unit being operable to transfer voltage parameters reported at the time of and after the predefined event occurred to the persistent storage.

* * * * *